US007148819B2

(12) United States Patent
Kim

(10) Patent No.: US 7,148,819 B2
(45) Date of Patent: Dec. 12, 2006

(54) DIRECTROMETER

(75) Inventor: Davis Lew Kim, Topanga, CA (US)

(73) Assignee: Davis Kim, Franklin, KY (US)

( * ) Notice: Subject to any disclaimer, the term of this patent is extended or adjusted under 35 U.S.C. 154(b) by 379 days.

(21) Appl. No.: 10/838,670

(22) Filed: May 3, 2004

(65) Prior Publication Data

US 2004/0217943 A1 Nov. 4, 2004

Related U.S. Application Data

(60) Provisional application No. 60/524,135, filed on Nov. 21, 2003, provisional application No. 60/467,955, filed on May 4, 2003.

(51) Int. Cl.
*H03K 17/94* (2006.01)
*H03M 11/00* (2006.01)

(52) U.S. Cl. ........................ 341/20; 345/156; 345/161; 463/38; 74/471 XY; 74/473.33

(58) Field of Classification Search .................. 341/20; 463/38, 47; 345/156, 161; 74/473.12, 473.3, 74/473.33, 471 XY, 479.01
See application file for complete search history.

(56) References Cited

U.S. PATENT DOCUMENTS

| | | | | |
|---|---|---|---|---|
| 6,429,849 | B1 * | 8/2002 | An et al. | 345/161 |
| 7,061,466 | B1 * | 6/2006 | Moore et al. | 345/156 |

* cited by examiner

*Primary Examiner*—Timothy Edwards, Jr.

(57) ABSTRACT

The purpose of this invention is to provide the complete set of spatial (translational) and axial (rotational) movement for a joystick due to the increasing demand of three-dimensional applications. Three degrees of freedom are provided for spatial movement which includes forward, backward, left, right, upward, and downward, plus an additional three degrees of freedom for axial movement which includes clockwise yaw, counterclockwise yaw, clockwise pitch, counterclockwise pitch, clockwise roll, and counterclockwise roll, for a total of six (6) degrees of freedom. The structure of the joystick that is required in order to demonstrate all six degrees of freedom is explained in the writing and sketches contained herein and is a testament to the novelty and unobviousness of this invention.

20 Claims, 7 Drawing Sheets

DIRECTROMETER

CROSS-REFERENCE TO RELATED APPLICATIONS

This non-provisional application for patent is a consolidation of two previously filed provisional patent applications and is entitled to the benefit of Provisional Patent Application Ser. No. 60/467,955 of The Ultimate 3D Joystick filed May 4, 2003 and to the benefit of Provisional Patent Application Ser. No. 60/524,135 of The Directrometer filed Nov. 21, 2003.

STATEMENT REGARDING FEDERALLY SPONSORED RESEARCH OR DEVELOPMENT

Not applicable.

REFERENCE TO SEQUENCE LISTING, A TABLE, OR A COMPUTER PROGRAM LISTING

Not applicable.

BACKGROUND—FIELD OF INVENTION

This invention relates to a multidimensional joystick controller, specifically a three-dimensional controller capable of six degrees of freedom.

BACKGROUND—DESCRIPTION OF PRIOR ART

In the past, joystick controllers were capable of only two degrees of freedom that allowed the user to communicate only forward, backward, left, and right movement in a two-dimensional plane. Recently, however, the increasing market of three-dimensional applications has created a high demand for a joystick that can properly demonstrate the entire set of movements that is necessary to communicate in a three-dimensional environment. Since the conventional two-dimensional joysticks of the past are capable of communicating only a limited set of movements, they are unable to correctly express the complete range of movement that is needed in a three-dimensional environment.

Several attempts have been made to expand the number of degrees of freedom of the joystick controller, including a few that claim to be able to express six degrees of freedom. However, most of these enhanced joystick controllers are very complicated in nature, are not very intuitive, are not very practical or realistic, are expensive to produce, and often limit the amount of movement to a small displacement distance. None offer the simplicity and structural integrity that would allow for the manufacture and widespread introduction of a realistic product into the marketplace.

SUMMARY OF THE INVENTION

Accordingly, several objects and advantages of the present invention are:

a. to provide a joystick that can demonstrate the entire set of movements that is necessary to communicate in a three-dimensional environment;

b. to provide a joystick that is simple and intuitive in both internal design for manufacturing purposes and operability and external structure for ease of use and learnability;

c. to provide a joystick that is practical and realistic to build and operate;

d. to provide a joystick that can be manufactured and produced at a reasonably small cost; and e. to provide a joystick that does not have too many limitations, such as a small displacement distance for certain movements, the requirement of a large amount of space, and the inability to operate near a magnetic field due to internally embedded magnetic devices.

Still further objects and advantages will become apparent after examining the following description and drawings.

REFERENCE NUMERALS

Figure 1:
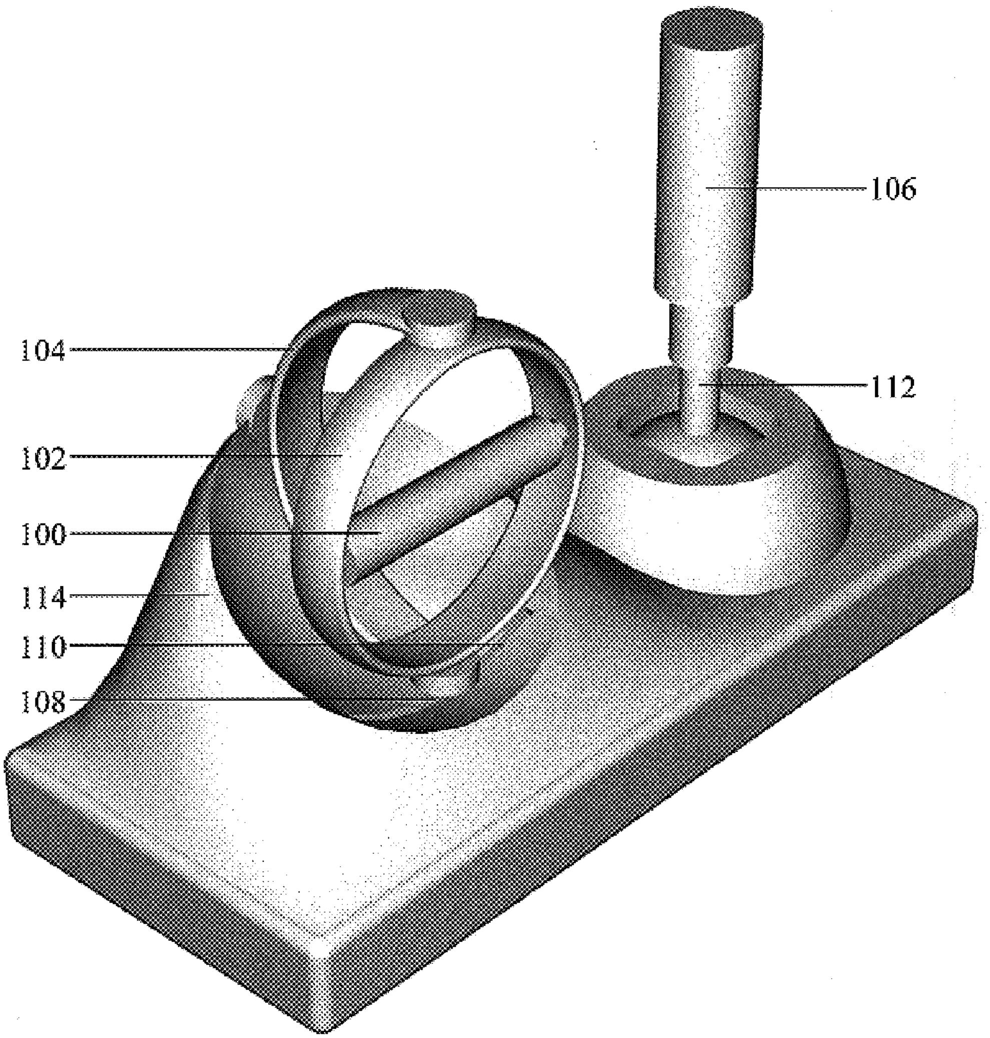
FIG. 1 is a perspective view of the preferred embodiment of the present invention.
Figure 2A:
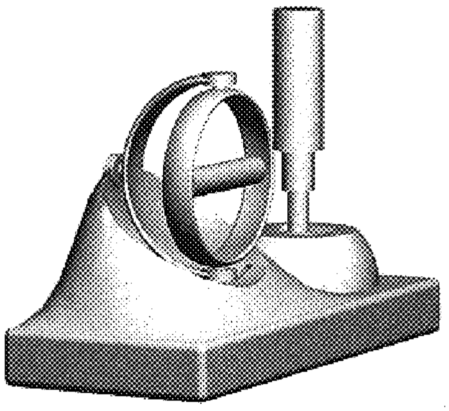
FIG. 2A is a perspective view of the preferred embodiment of the present invention, taken at a different angle than that of FIG. 1.
Figure 2B:
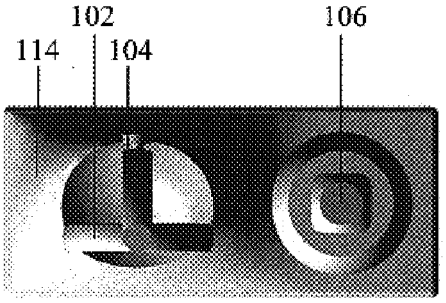
FIG. 2B is a top plan view of the preferred embodiment of the present invention.
Figure 2C:
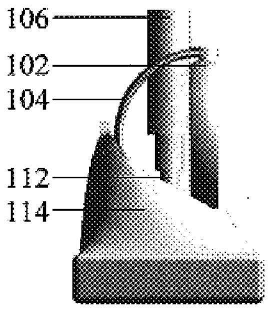
FIG. 2C is a left plan view of the preferred embodiment of the present invention.
Figure 2D:
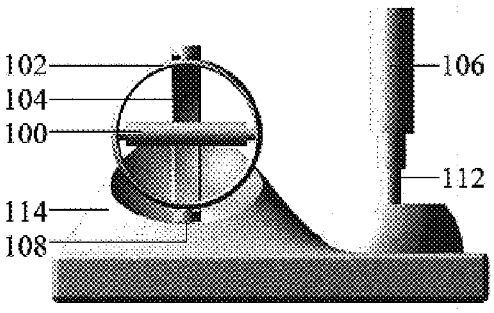
FIG. 2D is a front plan view of the preferred embodiment of the present invention.

100 first structure
102 second structure
104 third structure
106 joystick handle
108 protruding piece
110 extending groove
112 shaft
114 base
116 buttons
200 spring device used in FIG. 3
202 potentiometer used in FIG. 3
204 protruding member
206 cylindrical shaft
208 solid structure
300 spring device used in FIG. 4
302 potentiometer used in FIG. 4
304 small cylinder
306 spiral grooves

DESCRIPTION—PREFERRED EMBODIMENT

The preferred embodiment of the Directrometer (FIG. 1) comprises a base 114 with a left portion designed to handle the complete set of rotational movements and a right portion designed to handle the complete set of linear movements that behaves similarly to a conventional two-dimensional joystick capable of only forward, backward, left, and right movements, but further including upward and downward movement.

Figure 3A:
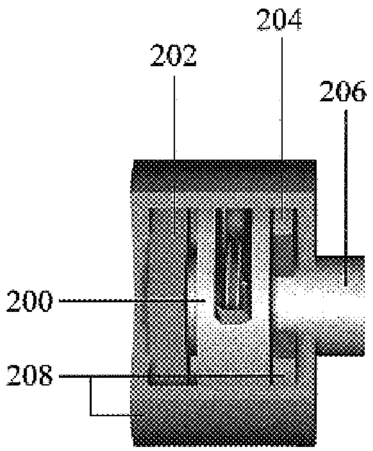
FIG. 3A is a perspective view of a means for controlling and measuring rotational displacement with a one-fourth slice of the solid structure housing removed.
Figure 3B:
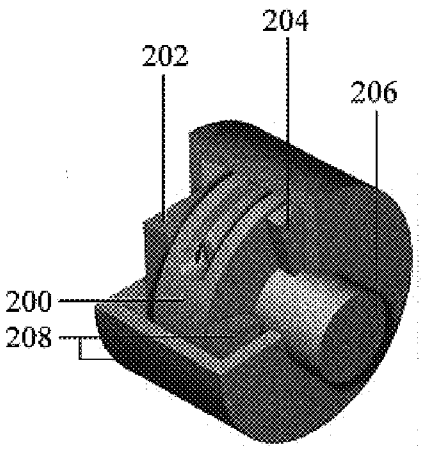
FIG. 3B is a perspective view of a means for controlling and measuring rotational displacement with a one-fourth slice of the solid structure housing removed, taken at a different angle than that of FIG. 3A.

A conventional two-dimensional joystick typically uses a spring device in order to provide a measure of tactile resistance to both the clockwise and counterclockwise direction of rotation and to distinguish the "center" or "neutral" position of rotation that behaves like a reference point from which to measure the amount of rotational displacement, such measurement typically made by an electromechanical device such as a potentiometer or an electro-optical device such as an optical encoder. The clockwise and counterclockwise rotation is strictly limited at a certain maximum displacement typically through the conjoining of two solid structures. For example, FIG. 3A and FIG. 3B show a typical setup in which a spring device 200 is attached to a cylindrical shaft 206, the ends of the spring meeting resistance upon a solid structure 208 such that cylindrical shaft 206 experiences rotational resistance proportional to the tension of the spring. One end of a potentiometer 202 is attached to the end of cylindrical shaft 206; the other end of potentiometer 202 is attached to solid structure 208 such that the rotational displacement of cylindrical shaft 206 can be measured by potentiometer 202. Finally, a protruding member 204 extends from cylindrical shaft 206 such that the "center" or "neutral" position of cylindrical shaft 206 caused by spring device 200 will also "center" protruding member 204 between two ends of solid structure 208, thereby creating an equal rotational distance in both the clockwise and counterclockwise direction that will serve as the maximum rotational displacement allowed. For brevity, since these methods of controlling and measuring rotational displacement are well known to those skilled in the art and are used repeatedly throughout the entire joystick, I will hereafter refer to this conventional method as "a means for controlling and measuring rotational displacement".

The left portion of the preferred embodiment comprises a first structure 100 that is shaped and situated in such a way as to be easily grasped by the left hand of the user. A variety of structures may exist that display different characteristics including different ergonomic designs, a vertical (parallel to the y-axis) or horizontal (parallel to the x-axis) cylindrical structure, or a plurality of buttons situated in a way that makes them easily accessible. For simplicity, in the preferred embodiment a horizontal cylindrical structure is used. First structure 100 is rotatably attached on one or both sides to a second structure 102 about the x-axis, the attachment offering a means for controlling and measuring rotational displacement. Second structure 102 again can take on several different forms without sacrificing utility. In the preferred embodiment, second structure 102 is a circular doughnut that accepts first structure 100 from within the inner surface and has a complementary configuration to accept first structure 100 in a rotatable manner and shares the assemblage of components that are necessary to provide a means for controlling and measuring rotational displacement. Second structure 102 is rotatably attached on one or both sides to a third structure 104 about the y-axis, the attachment offering a means for controlling and measuring rotational displacement. Third structure 104 again can take on several different forms without sacrificing utility. In the preferred embodiment, third structure 104 is a circular doughnut that is cut in half, this half-circular doughnut having a radius that is slightly larger than second structure 102 such that it is able to accept second structure 102 in a concentric fashion. Once again both second structure 102 and third structure 104 have complementary configuration that enables them to be attached in a rotatable manner and shares the assemblage of components that are necessary to provide a means for controlling and measuring rotational displacement. The "center" or "neutral" position of second structure 102 with respect to third structure 104 is such that they are perpendicular to each other according to the y-axis. Third structure 104 is rotatably attached on one or both sides to the left side of base 114 (or the fourth structure) about the z-axis, the attachment offering a means for controlling and measuring rotational displacement. Base 114 again can take on several different forms without sacrificing utility. In the preferred embodiment, base 114 is a rectangular piece whose left side comprises a structure designed to accept the left portion and whose right side comprises a structure designed to accept the right portion. Once again both third structure 104 and the left side of base 114 have complementary configuration that enables them to be attached in a rotatable manner and shares the assemblage of components that are necessary to provide a means for controlling and measuring rotational displacement. The "center" or "neutral" position of third structure 104 with respect to base 114 is such that third structure 104 is aligned perpendicularly to the surface of the rectangular piece of base 114.

Figure 4A:
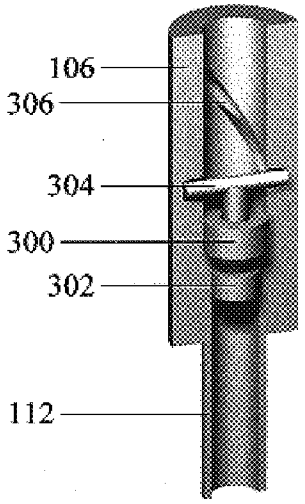
FIG. 4A is a perspective view of a means for controlling and measuring translational displacement with both the joystick handle and the shaft of the conventional two-dimensional joystick sliced in half.
Figure 4B:
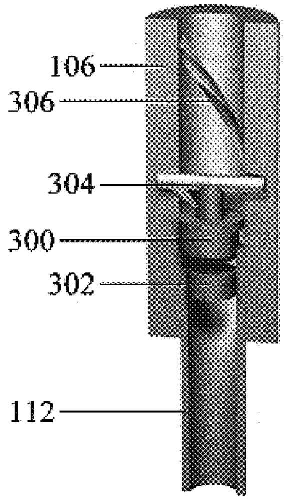
FIG. 4B is a perspective view of a means for controlling and measuring translational displacement with both the joystick handle and the shaft of the conventional two-dimensional joystick sliced in half, taken at a different angle than that of FIG. 4A.

The right portion is simply a conventional two-dimensional joystick that typically comprises two gimbals mounted perpendicularly to each other with a shaft 112 running through the square opening created by the perpendicular arrangement of the slits on the gimbals. Each gimbal is rounded on both ends in a cylindrical fashion such that it can freely rotate about a fixed axis with a means for controlling and measuring rotational displacement attached to one or both ends. The gimbals rotate within the right side of base 114 and are typically hidden from view by the outer encasing of base 114. In the preferred embodiment, a joystick handle 106 and shaft 112 are slidably attached such that the upward and downward motion of joystick handle 106 along shaft 112 is translated into rotational movement, so that a means for controlling and measuring rotational displacement can be employed in a uniform and consistent manner (FIG. 4A and FIG. 4B). This is accomplished by carving one or two spiral grooves 306 within the inner surface of the hollow, cylindrical portion of joystick handle 106, placing both a spring device 300 and a rotational displacement measuring device 302 on the top of shaft 112 of the right portion, and having a small cylinder 304 mounted on the top of shaft 112 with the center of small cylinder 304 rotating about the axis of shaft 112 and one or both ends of small cylinder 304 connecting slidably with spiral grooves 306.

The preferred embodiment can be further improved by adding more structural support. This can be accomplished by modifying both third structure 104 and the left side of base 114 such that they are in contact in a second manner. The lower end of third structure 104 could have a protruding piece 108 that slidably attaches to base 114. Base 114 could have an extending groove 110 that slidably receives protruding piece 108, thus offering greater structural integrity.

Operation—Preferred Embodiment

To operate the preferred embodiment of the Directrometer, the user simply places the left hand on first structure 100 of the left portion and the right hand on joystick handle 106 of the right portion and with a gripping motion firmly secures both portions so that the movement of either hand will cause the movement of its respective portion. The user can utilize all six degrees of freedom by applying force in the respective direction, either translational with the right hand or rotational with the left hand, and through the attachment of all the combined structures the desired movement will be accurately recorded according to the direction in which the force was applied by the user's hands. For example, if the user wishes to communicate a forward motion, the user would simply push the right gripping hand in the forward direction. If instead the user wishes to communicate a clockwise rotation about the x-axis, the user would simply rotate the left gripping hand in the clockwise direction according to the x-axis. The user can also combine several movements simultaneously to achieve a multitude of directional commands, such as forward, right, rotation in the clockwise direction about the y-axis, and rotation in the counterclockwise direction about the z-axis all occurring simultaneously. There are a total of six independent directional choices, each choice having three distinct possible positions (clockwise, counterclockwise, and neutral or "off"), for a total of 3×3×3×3×3×3=729 possible combinations. The user can operate a plurality of buttons 116 that may be present on the joystick by simply pressing down on the button of choice to activate it, and releasing the button to return it to an inactive state. Operation of the Directrometer may include installing appropriate software and connecting the joystick to an appropriate interface. The software may also provide further options to "customize" the abilities of the joystick by allowing the user to change the standard operation of the joystick or the connections between the directional commands and the desired output, and also by allowing the assignment of a function to buttons 116.

Description and Operation—Alternative Embodiments

Figure 5A:
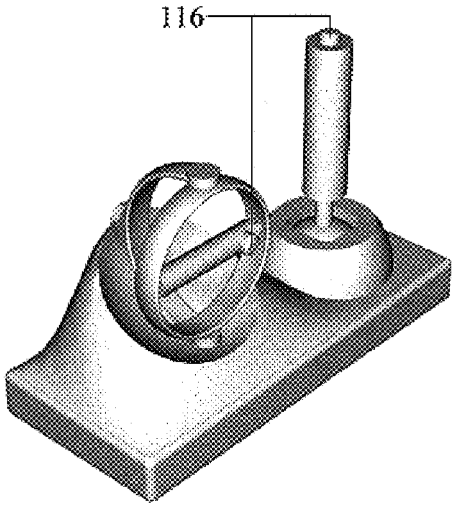
FIG. 5A is a perspective view of the preferred embodiment without the protruding piece, the extending groove, and the upward and downward capability and including a button on the first structure and the joystick handle.

An alternative embodiment may be removing the upward and downward capability of the joystick, thus offering only five degrees of freedom (FIG. 5A).

Figure 5B:
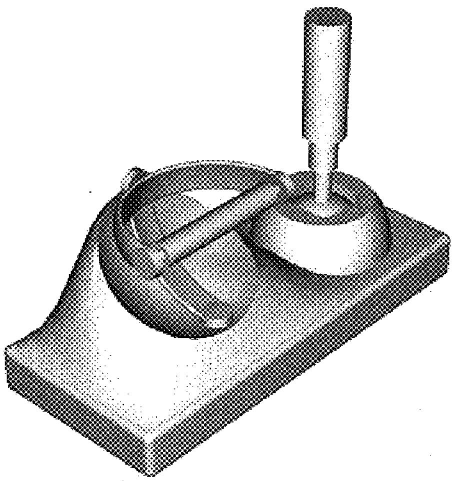
FIG. 5B is a perspective view of an alternative embodiment with the axes order of (x, z, y).
Figure 5C:
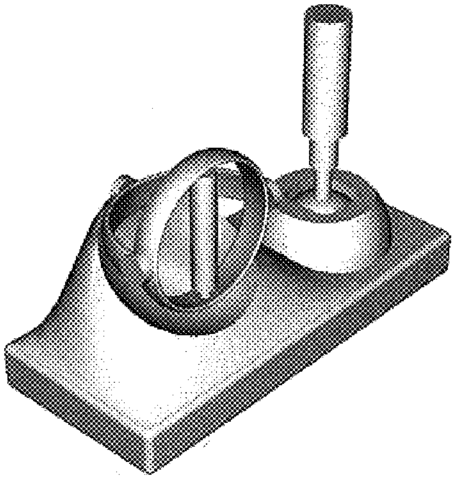
FIG. 5C is a perspective view of an alternative embodiment with the axes order of (y, x, z).
Figure 5D:
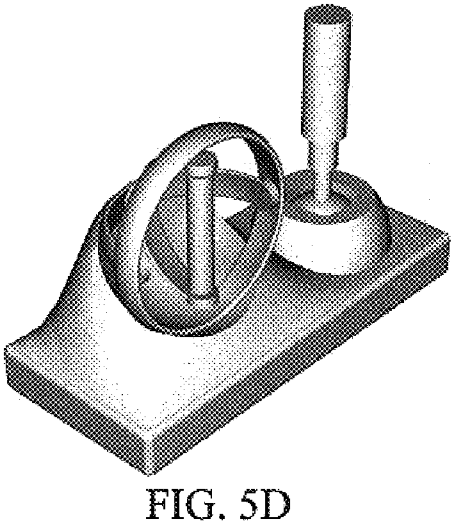
FIG. 5D is a perspective view of an alternative embodiment with the axes order of (y, z, x).
Figure 5E:
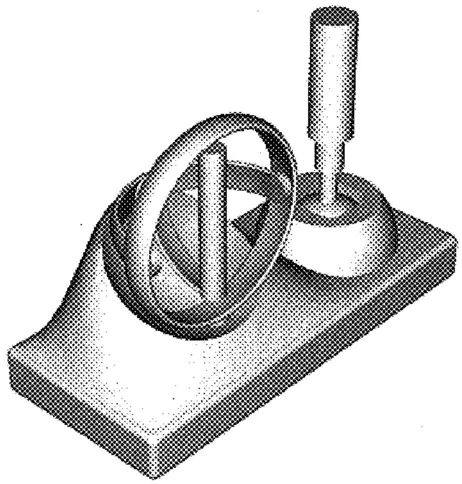
FIG. 5E is a perspective view of an alternative embodiment with the axes order of (z, x, y).
Figure 5F:
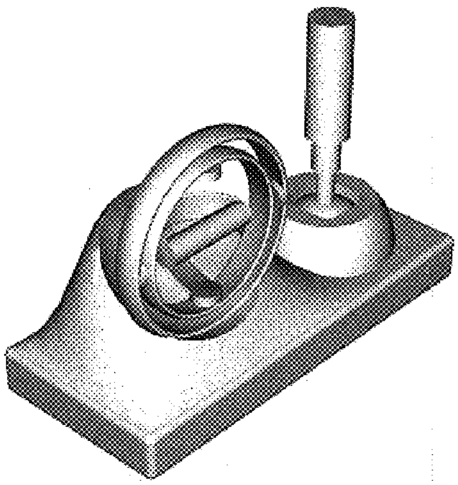
FIG. 5F is a perspective view of an alternative embodiment with the axes order of (z, y, x).

Another five alternative embodiments exist given the rearrangement of the order of the axes in which the structures are rotatably attached. For example, the preferred embodiment uses the order (x, y, z)-FIG. 5A. However, five more orders exist including (x, z, y)-FIG. 5B, (y, x, z)-FIG. 5C, (y, z, x)-FIG. 5D, (z, x, y)-FIG. 5E, and (z, y, x)-FIG. 5F. These alternative embodiments, though perhaps different in shape and structure, are effectively producing the same result by providing three degrees of rotational freedom.

Figure 6A:
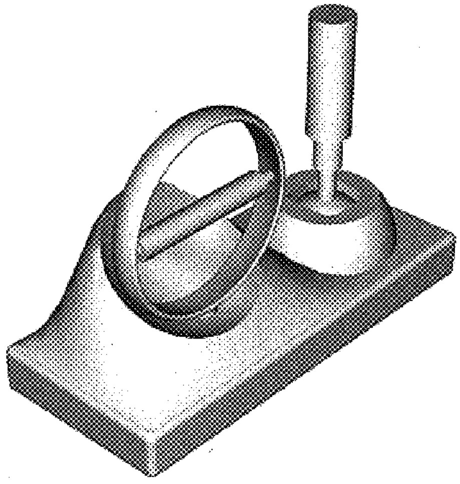
FIG. 6A is a perspective view of an alternative embodiment with the axes order of (x, y).
Figure 6B:
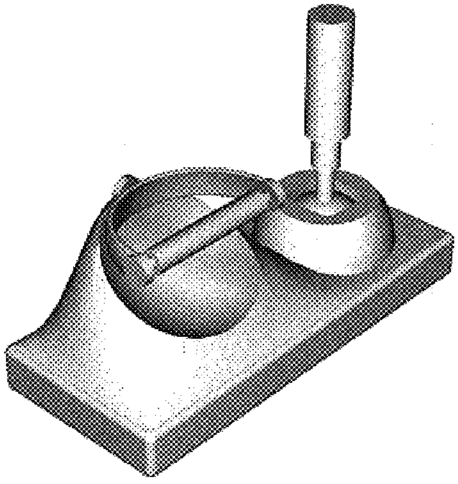
FIG. 6B is a perspective view of an alternative embodiment with the axes order of (x, z).
Figure 6C:
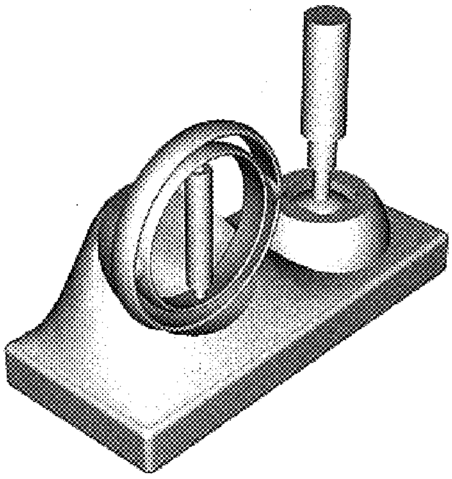
FIG. 6C is a perspective view of an alternative embodiment with the axes order of (y, x).
Figure 6D:
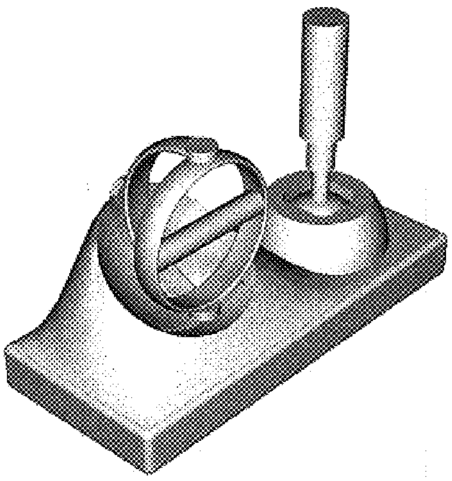
FIG. 6D is a perspective view of an alternative embodiment with the axes order of (y, z).
Figure 6E:
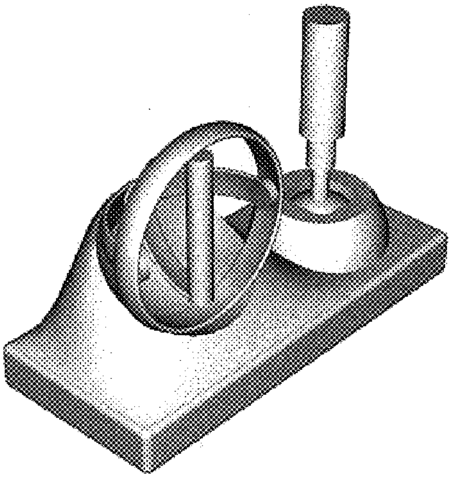
FIG. 6E is a perspective view of an alternative embodiment with the axes order of (z, x).
Figure 6F:
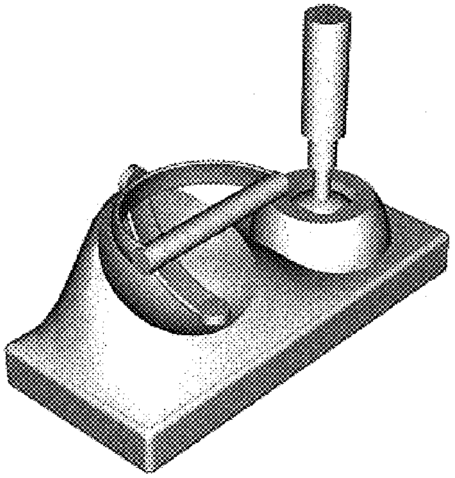
FIG. 6F is a perspective view of an alternative embodiment with the axes order of (z, y).

Another six alternative embodiments exist by removing one of the axes (similar to removing the upward and downward movement), thus offering only five degrees of freedom (or only four degrees of freedom if coupled with the removal of the upward and downward movement). The six orders that exist include (x, y)-FIG. 6A, (x, z)-FIG. 6B, (y, x)-FIG. 6C, (y, z)-FIG. 6D, (z, x)-FIG. 6E, and (z, y)-FIG. 6F.

Figure 7A:
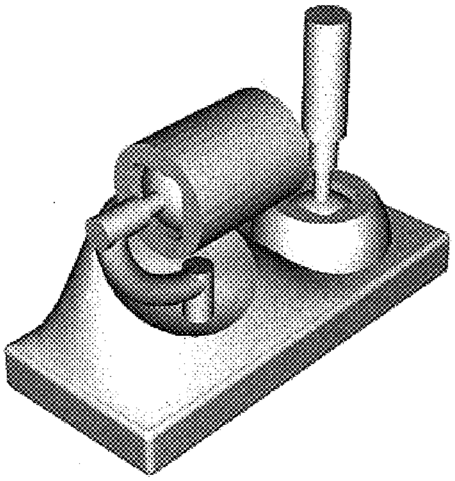
FIG. 7A is a perspective view of an alternative embodiment with the shaft of the left portion conventional two-dimensional joystick aligned according to the x-axis.
Figure 7B:
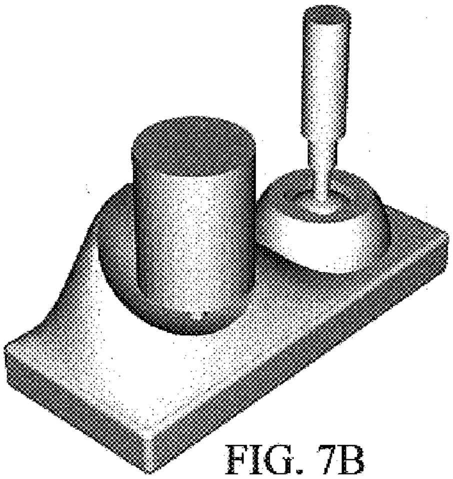
FIG. 7B is a perspective view of an alternative embodiment with the shaft of the left portion conventional two-dimensional joystick aligned according to the y-axis.
Figure 7C:
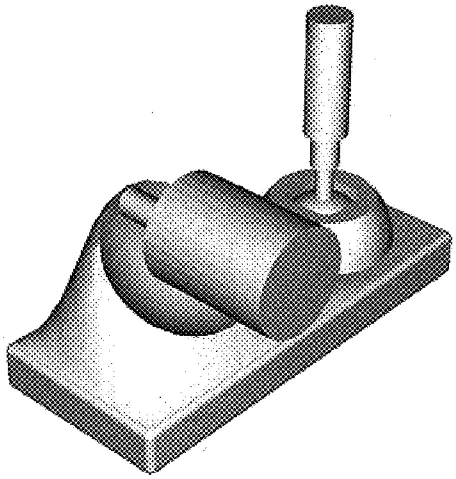
FIG. 7C is a perspective view of an alternative embodiment with the shaft of the left portion conventional two-dimensional joystick aligned according to the z-axis.

Another three alternative embodiments exist by replacing the left portion with a conventional two-dimensional joystick such that the shaft of the left portion conventional two-dimensional joystick is attached to the left side of base 114 about the x-axis (FIG. 7A), the y-axis (FIG. 7B), or the z-axis (FIG. 7C). Instead of a base, however, the outer encasing of the left portion which houses the gimbals can be a structure similar to the first structure of the preferred embodiment that is shaped and situated in such a way as to be easily grasped by one hand of the user. Similarly to the other embodiments, upward and downward translational movement or clockwise and counterclockwise rotational movement about the axis of the shaft of the left portion, or a combination of both, may be added or removed in order to specify the number of degrees of freedom from a range of four to six.

Another alternative embodiment exists by replacing the left portion with a ball handle that is designed to handle the complete set of rotational movements. There is another type of controller that offers six degrees of freedom that utilizes a ball handle to offer the complete set of rotational and linear movements. The difference, however, is that the ball handle would only handle the rotational movements and not the linear movements and would be attached to the left side of a base that also offers a right portion that handles the linear movements.

Figure 7D:
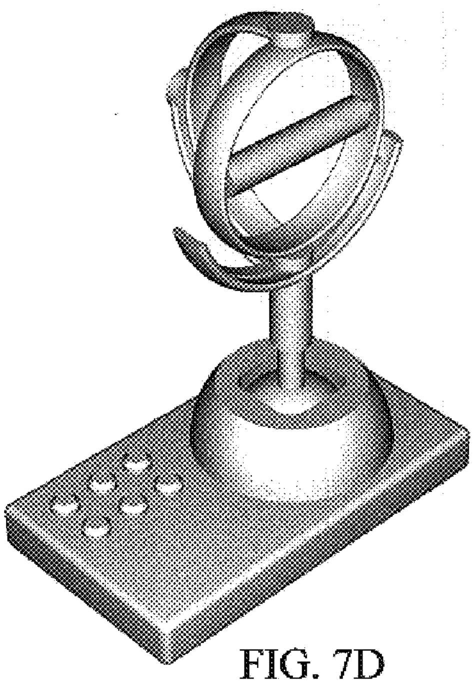
FIG. 7D is a perspective view of an alternative embodiment that allows one-handed operation.

Another alternative embodiment exists by rotatably attaching the third structure of the left portion to the joystick handle of the right portion about the z-axis (FIG. 7D) rather than attaching the third structure to the left side of the base, thereby making the joystick handle the fourth structure. This allows for a one-handed version previously entitled The Ultimate 3D Joystick, and all the above alternative embodiments may be applied towards this embodiment in a similar fashion.

It should be noted that any further embodiments that may be conceived in the future by later inventors which demonstrate similar or the same function should be rigorously inspected to be both novel and unobvious in comparison to this invention to those skilled in the art, and that such embodiments are not an obvious result that anyone who is skilled in the art can deduce given the disclosure of the present invention.

Conclusion, Ramifications, and Scope

Several different ramifications exist for this invention, and such replacements by the following alternatives should not be considered a substantial deviation from the spirit and scope of this invention.

a. Although the preferred material that can be used to build the joystick is molded plastic that is pieced together by metal screws in such a way as to offer a hollow interior for various electrical components, several different alternatives for the type of material exist such as nylon, aluminum, hardened rubber, or any other type of rigid material that is commonly known to those skilled in the art.

b. A plurality of buttons may be situated throughout the entire fabrication that will allow the user to further communicate his commands or intentions, although perhaps the first structure or the joystick handle are the most appropriate places.

c. Only the preferred "means for controlling and measuring rotational displacement" has been discussed in detail. However, there may be other methods of accomplishing the same task such as the aforementioned optical encoder or switch arrays, piezo-electric transducers, strain-gauges, capacitive coupling devices, inductive coupling devices, magnetic devices, sensors, actuators, electro-optical shaft angle encoders, or any other methods that are known to those skilled in the art.

d. Only the preferred means for translating upward and downward movement into rotational movement has been discussed in detail. Again, other methods of accomplishing the same task may exist that are well known to those skilled in the art.

e. A means for securing the base to a stationary object such as a table or desk can also be applied, such means may be achieved by suction cups attached to the bottom, vice grips that are able to grip on to the edge of a table, or magnets attached to the bottom, but other, more convenient methods may also be known to those skilled in the art.

f. As mentioned previously, different shapes may exist for all the structures (especially the first structure that is grasped by the user) such as a more "square-like" design with sharp edges instead of the circular doughnut design, or an ergonomic handgrip for the first structure or joystick handle.

g. As mentioned previously, the addition of structural support such as the extending groove can be included or removed, along with other various structural supports that may make the joystick more stable such as a T-bar bracing.

h. An elbow-rest may be supplied by a separate or integrated structure that is shaped and situated as to comfortably allow the user to rest his arms or elbows while utilizing the joystick, so that cramps, fatigue, or long-term discomfort may be minimized or eliminated.

i. A force feedback mechanism may be applied to the joystick to allow for a more realistic interaction with a virtual environment.

I claim:

1. A multidimensional controller comprising:

a. a first structure that is shaped and situated as to be easily grasped by one hand of a user, b. a second structure that is rotatably attached to said first structure about a first axis, c. a third structure that is rotatably attached to said second structure about a second axis that is orthogonal to said first axis, the point of intersection between said first axis and said second axis substantially occupying the same region of space enclosed by said hand of said user, d. a first means for controlling and measuring rotational displacement for the rotatable attachment between said first structure and said second structure, and e. a second means for controlling and measuring rotational displacement for the rotatable attachment between said second structure and said third structure, whereby the direction and magnitude of the force applied by said hand of said user will be accurately measured.

2. The controller of claim 1 further including a conventional two-dimensional joystick, said third structure attached to said conventional two-dimensional joystick.

3. The controller of claim 2 wherein the attachment between the handle and the shaft of said conventional two-dimensional joystick is slidable and includes a fourth means for controlling and measuring displacement for the slidable attachment between said handle and said shaft.

4. The controller of claim 3 wherein said first means and said second means comprises:

a. a housing, b. a cylinder that is rotatably attached to said housing, c. a spring device attached to said cylinder or said housing that provides resistance in both the clockwise and counterclockwise direction of rotation, said spring device offering a center or neutral position of rotation in which no resistance is applied, d. a rotational displacement measuring device that is situated between said cylinder and said housing such that the rotational displacement of said cylinder with respect to said housing can be measured, the center or neutral position of said rotational displacement measuring device coinciding with the center or neutral position provided by said spring device, and e. a protruding member that extends from said cylinder or said housing that strictly limits the rotational displacement in both the clockwise and counterclockwise direction of rotation by conjoining with a solid portion of said cylinder or said housing at a certain maximum displacement in both the clockwise and counterclockwise direction, the center or neutral position of said protruding member coinciding with the center or neutral position provided by said spring device.

5. The controller of claim 4 wherein said fourth means comprises:

a. a plurality of spiral-shaped grooves within the inner hollow surface of said handle, b. a small cylinder whose center is rotatably attached to the top of said shaft and whose ends are slidably connected to said spiral-shaped grooves such that the displacement of said small cylinder with respect to said spiral-shaped grooves will cause the rotational displacement of said small cylinder, and c. a fifth means for controlling and measuring rotational displacement for the rotatable attachment between the center of said cylinder and the top of said shaft, said fifth means similar to said first means and said second means.

6. The controller of claim 5 wherein said conventional two-dimensional joystick comprises:

a. a housing base having a large square-like opening, b. two gimbals rotatably attached perpendicularly to each other within said housing base, said gimbals each having a lengthwise slit such that a small square-like opening is created due to the perpendicular arrangement of said gimbals, said gimbals each having cylindrically rounded ends such that they can freely rotate about two orthogonal axes, c. said shaft running through said small square-like opening in a tight fitting, said shaft running through said large square-like opening, and d. a sixth means for controlling and measuring rotational displacement for the rotatable attachment between the cylindrically rounded ends of said gimbals and said housing base, said sixth means similar to said fifth means.

7. The controller of claim 1 further including:

a. a fourth structure that is rotatably attached to said third structure about a third axis that is orthogonal to both said first axis and said second axis, and b. a third means for controlling and measuring rotational displacement for the rotatable attachment between said third structure and said fourth structure.

8. The controller of claim 7 further including a conventional two-dimensional joystick, said fourth structure attached to said conventional two-dimensional joystick.

9. The controller of claim 8 wherein the attachment between the handle and the shaft of said conventional two-dimensional joystick is slidable and includes a fourth means for controlling and measuring displacement for the slidable attachment between said handle and said shaft.

10. The controller of claim 9 wherein said first means, said second means, and said third means comprises:

a. a housing, b. a cylinder that is rotatably attached to said housing, c. a spring device attached to said cylinder or said housing that provides resistance in both the clockwise and counterclockwise direction of rotation, said spring device offering a center or neutral position of rotation in which no resistance is applied, d. a rotational displacement measuring device that is situated between said cylinder and said housing such that the rotational displacement of said cylinder with respect to said housing can be measured, the center or neutral position of said rotational displacement measuring device coinciding with the center or neutral position provided by said spring device, and e. a protruding member that extends from said cylinder or said housing that strictly limits the rotational displacement in both the clockwise and counterclockwise direction of rotation by conjoining with a solid portion of said cylinder or said housing at a certain maximum displacement in both the clockwise and counterclockwise direction, the center or neutral position of said protruding member coinciding with the center or neutral position provided by said spring device.

11. The controller of claim 10 wherein said fourth means comprises:

a. a plurality of spiral-shaped grooves within the inner hollow surface of said handle, b. a small cylinder whose center is rotatably attached to the top of said shaft and whose ends are slidably connected to said spiral-shaped grooves such that the displacement of said small cylinder with respect to said spiral-shaped grooves will cause the rotational displacement of said small cylinder, and c. a fifth means for controlling and measuring rotational displacement for the rotatable attachment between the center of said cylinder and the top of said shaft, said fifth means similar to said first means, said second means, and said third means.

12. The controller of claim 11 wherein said conventional two-dimensional joystick comprises:

a. a housing base having a large square-like opening, b. two gimbals rotatably attached perpendicularly to each other within said housing base, said gimbals each having a lengthwise slit such that a small square-like opening is created due to the perpendicular arrangement of said gimbals, said gimbals each having cylindrically rounded ends such that they can freely rotate about two orthogonal axes, c. said shaft running through said small square-like opening in a tight fitting, said shaft running through said large square-like opening, and d. a sixth means for controlling and measuring rotational displacement for the rotatable attachment between the cylindrically rounded ends of said gimbals and said housing base, said sixth means similar to said fifth means.

13. A multidimensional controller comprising:

a. a first conventional two-dimensional joystick capable of two-axis movement, said first conventional two-dimensional joystick having a first shaft and a first housing based, and b. a second conventional two-dimensional joystick capable of two-axis movement, the second shaft of said second conventional two-dimensional joystick attached to said first conventional two-dimensional joystick, the second housing base of said second conventional two-dimensional joystick having a structure that is shaped and situated as to be easily grasped by one hand of a user.

14. The controller of claim 13 wherein the attachment between said second shaft and said first conventional two-dimensional joystick is made such that they are rotatably connected and includes a first means for controlling and measuring rotational displacement for the rotatable attachment between said second shaft and said first conventional two-dimensional joystick.

15. The controller of claim 14 wherein the attachment between the first handle and the first shaft of said first conventional two-dimensional joystick further includes a slidable connection and includes a second means for controlling and measuring displacement for the slidable attachment between said handle and said first shaft.

16. The controller of claim 15 wherein said first means comprises:

a. a housing, b. a cylinder that is rotatably attached to said housing, c. a spring device attached to said cylinder or said housing that provides resistance in both the clockwise and counterclockwise direction of rotation, said spring device offering a center or neutral position of rotation in which no resistance is applied, d. a rotational displacement measuring device that is situated between said cylinder and said housing such that the rotational displacement of said cylinder with respect to said housing can be measured, the center or neutral position of said rotational displacement measuring device coinciding with the center or neutral position provided by said spring device, and e. a protruding member that extends from said cylinder or said housing that strictly limits the rotational displacement in both the clockwise and counterclockwise direction of rotation by conjoining with a solid portion of said cylinder or said housing at a certain maximum displacement in both the clockwise and counterclockwise direction, the center or neutral position of said protruding member coinciding with the center or neutral position provided by said spring device.

17. The controller of claim 16 wherein said second means comprises:

a. a plurality of spiral-shaped grooves within the inner hollow surface of said first handle, b. a small cylinder whose center is rotatably attached to the top of said first shaft and whose ends are slidably connected to said spiral-shaped grooves such that the displacement of said small cylinder with respect to said spiral-shaped grooves will cause the rotational displacement of said small cylinder, and c. a third means for controlling and measuring rotational displacement for the rotatable attachment between the center of said cylinder and the top of said first shaft, said third means similar to said first means.

18. The controller of claim 17 wherein said first conventional two-dimensional joystick comprises:

a. said first housing base having a large square-like opening, b. two gimbals rotatably attached perpendicularly to each other within said first housing base, said gimbals each having a lengthwise slit such that a small square-like opening is created due to the perpendicular arrangement of said gimbals, said gimbals each having cylindrically rounded ends such that they can freely rotate about two orthogonal axes, c. said first shaft running through said small square-like opening in a tight fitting, said first shaft running through said large square-like opening, and d. a fourth means for controlling and measuring rotational displacement for the rotatable attachment between the cylindrically rounded ends of said gimbals and said first housing base, said fourth means similar to said third means.

19. The controller of claim 17 wherein said second conventional two-dimensional joystick comprises:

a. said second housing base having a large square-like opening, b. two gimbals rotatably attached perpendicularly to each other within said second housing base, said gimbals each having a lengthwise slit such that a small square-like opening is created due to the perpendicular arrangement of said gimbals, said gimbals each having cylindrically rounded ends such that they can freely rotate about two orthogonal axes, c. said second shaft running through said small square-like opening in a tight fitting, said second shaft running through said large square-like opening, and d. a fourth means for controlling and measuring rotational displacement for the rotatable attachment between the cylindrically rounded ends of said gimbals and said second housing base, said fourth means similar to said third means.

20. A method of measuring the direction and magnitude of the force applied by two hands of a user comprising:

a. providing a base, b. providing a first structure that is shaped and situated as to be easily grasped by the right hand of said user, c. providing a second structure that is shaped and situated as to be easily grasped by the left hand of said user, d. providing a right portion of said base that is attached to said first structure such that the translational movement of said first structure with respect to said right portion about three orthogonal axes can be measured, e. providing a left portion of said base that is attached to said second structure such that the rotational movement of said second structure with respect to said left portion about three orthogonal axes can be measured, f. providing a first means for controlling and measuring the translational displacement between said first structure and said right portion of said base, and g. providing a second means for controlling and measuring the rotational displacement between said second structure and said left portion of said base.

* * * * *